(12) United States Patent
Hill (10) Patent No.: US 8,193,916 B2
(45) Date of Patent: *Jun. 5, 2012

(54) RFID TRANSMITTER

(75) Inventor: Nicholas Patrick Roland Hill, Cambridge (GB)

(73) Assignee: Cambridge Resonant Technologies Ltd., Cambridge (GB)

( * ) Notice: Subject to any disclaimer, the term of this patent is extended or adjusted under 35 U.S.C. 154(b) by 45 days.

This patent is subject to a terminal disclaimer.

(21) Appl. No.: 12/618,650

(22) Filed: Nov. 13, 2009

(65) Prior Publication Data

US 2010/0102932 A1    Apr. 29, 2010

Related U.S. Application Data

(63) Continuation of application No. PCT/GB2008/050335, filed on May 7, 2008, and a continuation-in-part of application No. 12/119,263, filed on May 12, 2008.

(30) Foreign Application Priority Data

May 18, 2007 (GB) .................................. 0709575.5

(51) Int. Cl.
    *H04Q 5/22* (2006.01)
(52) U.S. Cl. ................... 340/10.4; 340/10.1; 331/117 R
(58) Field of Classification Search ............... 340/10.1, 340/10.4, 572.5; 455/73; 363/17, 132, 20, 363/98; 327/553, 596, 100, 190; 331/74, 331/117 R, 166
    See application file for complete search history.

(56) References Cited

U.S. PATENT DOCUMENTS

| 5,283,529 | A | * | 2/1994 | Meier | 327/596 |
| 5,374,930 | A | * | 12/1994 | Schuermann | 342/42 |
| 5,488,272 | A | * | 1/1996 | Cotton | 315/408 |
| 6,044,795 | A | | 4/2000 | Matsuura | |
| 6,396,716 | B1 | * | 5/2002 | Liu et al. | 363/17 |
| 6,650,226 | B1 | | 11/2003 | Wuidart | |
| 6,806,783 | B2 | * | 10/2004 | Baumann et al. | 331/74 |

(Continued)

FOREIGN PATENT DOCUMENTS

EP    1589656 A1    10/2005

(Continued)

OTHER PUBLICATIONS

European Search Report & Written Opinion from co-pending Application EP10187234, completion date Jan. 26, 2011.

(Continued)

*Primary Examiner* — Albert Wong
*Assistant Examiner* — Peter Mehravari
(74) *Attorney, Agent, or Firm* — Wolf, Greenfield & Sacks, P.C.

(57) ABSTRACT

Embodiments of the invention relate to the field of RFID interrogators, particularly RFID interrogators that combine low loss with high rates of communication from the interrogator to a tag. Further embodiments relate to the field of active RFID tags and general radio transmitters. We describe a transmitter comprising a resonant circuit and a driver coupled to drive said resonant circuit, wherein said resonant circuit includes a resonance regeneration system such that during amplitude modulation of a resonant signal in said resonant circuit when an amplitude of said resonant signal is reduced energy from said reduction is stored and when said amplitude is increased said stored energy is used to regenerate said resonance signal.

20 Claims, 11 Drawing Sheets

U.S. PATENT DOCUMENTS

| | | | |
|---|---|---|---|
| 6,930,893 B2 * | 8/2005 | Vinciarelli | 363/17 |
| 7,145,451 B2 * | 12/2006 | Ward, Jr. | 340/506 |
| 7,145,786 B2 * | 12/2006 | Vinciarelli | 363/17 |
| 7,561,446 B1 * | 7/2009 | Vinciarelli | 363/17 |
| 7,642,728 B2 * | 1/2010 | Moisin | 315/291 |
| 2005/0041441 A1 * | 2/2005 | Nagai et al. | 363/21.06 |
| 2009/0130988 A1 * | 5/2009 | Goldberg | 455/73 |

FOREIGN PATENT DOCUMENTS

| | | |
|---|---|---|
| GB | 2381180 A | 4/2003 |
| WO | WO 95/35609 A1 | 12/1995 |
| WO | WO 98/01837 A1 | 1/1998 |
| WO | WO 2007/068974 A | 6/2007 |
| WO | WO 2007/068975 A | 6/2007 |

OTHER PUBLICATIONS

European Search Report & Written Opinion from co-pending Application EP10187234, completion date Jan. 21, 2011.

International Search Report in corresponding PCT/GB2008/050335, mailed Sep. 26, 2008.

* cited by examiner

RFID TRANSMITTER

CROSS-REFERENCE TO RELATED APPLICATIONS

This application is a continuation of international application no. PCT/GB2008/050335, filed May 7, 2008, and is also a continuation-in-part of Ser. No. 12/119,263, filed May 12, 2008, both of which in turn claim priority to GB0709575.5, filed May 18, 2007.

FIELD OF INVENTION

Embodiments of the invention relate to the field of transmitters, particularly RFID transmitters that combine low loss with high rates of communication. Embodiments of the invention include RFID interrogators, active RFID tags, and general radio transmitters.

BACKGROUND TO THE INVENTION

In an RFID system resonant circuits are generally used in both the reader and the transponder. Their use increases the efficiency of energy transfer between the two circuits, which would otherwise be much lower, severely limiting the range of operation. Optimal read range may be achieved when the reader is stimulated at its resonance frequency, and this also matches the resonant frequency of the transponder.

The inventor's earlier patent applications PCT/GB2006/050436 and PCT/GB2006/050440 outline methods that allow the use of a high Q antenna in an RFID reader. These methods prevent the conventional problems of a high Q resonant system associated with a narrow bandwidth. Firstly, a resonator is described that naturally tunes to the stimulus frequency over a wide bandwidth, independent of the level of loss. Secondly, a feedback method is described that increases the speed of response of the reader to load modulation in the tag, whilst maintaining the low loss for slowly varying signals.

An RFID interrogator provides for both tag to reader communication and also reader to tag communication. The prior art provides an improved efficiency method for tag to reader communications through the use of a high Q antenna. However, for reader to tag communications modulations of the reader energising field are required. A high Q resonator may not provide sufficient speed of response to allow amplitude modulations at the required rate simply through turn off and turn on of the stimulus. Obvious extensions to this are the use of a damping circuit to attenuate the reader field quickly at turn off, and drawing increased current from the power supply to accelerate the subsequent turn on.

The drawback of these prior art methods are that the turn on/off time may still be limited, and also they involve the dissipation of the resonance energy at each modulation. When data is passed from the reader to the tag, for example in programming or password exchange, the benefits of the high Q reader antenna will not be realised.

There is therefore the requirement for an RFID interrogator capable of both efficient tag to reader communication and also efficient reader to tag communication.

There are similar requirements for active RFID tags. Here a powered tag contains a transmitter for communication to a base station or another tag. A high Q resonator gives efficient operation increasing battery lifetime for given transmitter amplitude, however this also limits the achievable rate of amplitude modulations. The rate of modulation may be increased through the use of dissipation of the resonator energy, however this reduces the efficiency and the benefits of the high Q reader antenna will not be realised.

In fact any transmitter has limits on data rate when based on a resonator with a given Q. There is therefore a general requirement for a transmitter capable of both efficient operation and high speed communication.

SUMMARY OF THE INVENTION

The invention is set forth in the independent claims.

In embodiments the field generated by an RFID interrogator may be modulated at a high rate without the energy loss associated with dissipation of the resonance energy at each modulation cycle.

In other embodiments the field generated by an active RFID tag may be modulated at a high rate without the energy loss associated with dissipation of the resonance energy at each modulation cycle.

In still further embodiments the field generated by a general radio transmitter may be modulated at a high rate without the energy loss associated with dissipation of the resonance energy at each modulation cycle.

In embodiments the oscillation of the resonator is stopped suddenly and the resonance energy stored in the form of charge. Transients may be generated when the resonator is stopped and these may be controlled with a separate block to dissipate such unwanted currents.

The energy stored when the resonator is stopped may be recycled when the resonator is turned back on. The resonator may therefore be re-started in a high amplitude, without the usual time constant associated with ramp up of a resonant system from a low energy state.

The resonator may be a nonlinear resonator incorporating a MOSFET that is switched over on/off over a full cycle in response to the amplitude of a waveform in the resonator. Such a resonator has the beneficial property that it is able to adapt to the driving frequency over a given bandwidth, independent of the level of loss in the circuit. This allows a high Q resonator to be used in the RFID interrogator, active RFID tag, or general radio transmitter without a fine tuning circuit.

Alternatively the resonator may be a conventional linear resonator and may include a tuning circuit.

The RFID interrogator, active RFID tag, or general radio transmitter may incorporate feedback to reduce transient changes in the amplitude of the resonator. Implementation of feedback may improve the speed of response of the interrogator when used as a reader. Also the feedback may reduce transients in the amplitude of the resonator when it is restarted over the course of the modulation of the interrogator field. Alternatively the RFID interrogator may not implement feedback.

The interrogator, active RFID tag, or general radio transmitter may measure the behaviour in normal oscillation to determine the timing of the stimulus pulses relative to the resonance current. It may then use this to calculate a turn on time that will result in a more smooth turn on waveform. Alternatively the interrogator, active RFID tag, or general radio transmitter may turn on with a default timing and the feedback may reduce the transient changes in the resonator amplitude.

Modulation for the interrogator field may be used for reader to tag communications, including tag programming and password exchange for encryption. Modulation for the active RFID tag, or general radio transmitter may be used for data transfer.

The modulation may be used for half duplex reading in addition to full duplex reading.

The methods outlined in this patent, although focused on RFID interrogation, may generally applied to amplitude modulation. These methods allow high-speed communication with high efficiency and improve on conventional methods that may dissipate the energy in the modulating signal. They may be applied to any application where decreased turn off or turn on times of an oscillatory signal are required.

The methods may be applied over a wide frequency band ranging from sub-sonic to microwave frequencies and beyond. More specifically to RFID, all common RFID frequency bands are included, such as 125 kHz, 134 kHz, 13.56 MHz, 869 MHz, 915 MHz, etc.

Broadly we will describe the following areas
1. A resonator that is made to undergo amplitude modulation such that when it is turned off the energy is stored as potential energy in the resonator capacitors, and is subsequently reused when turned back on again.
2. A circuit incorporating the resonator of point 1, and also including a block to reduce the amplitude of turn off transients.
3. A circuit incorporating the resonator of point 1 or 2 that also uses feedback to minimise the transient changes to the amplitude of the resonator, which may be used to speed up the response of resonator to load modulation in a tag.
4. A circuit according to any of the above points that also uses feedback to minimise the transient changes to the amplitude of the resonator, which may be used reduce the amplitude and/or duration of turn on transients.
5. A circuit according to any of the above points that makes use of a nonlinear adaptive resonator.
6. A circuit according to any of the above points that makes use of a high Q antenna with a Q preferably greater than 20 and more preferably greater than 50.
7. An RFID interrogator based on any of the above points.
8. A communication system based on any of the above points.
9. A wireless energy transfer system based on any of the above points.
10. An system that measures the timing of the stimulus pulses relative to the antenna current in normal operation and then uses this to calculate the timing for turn on. This may be used to improve the smoothness of the turn on waveform.

BRIEF DESCRIPTION OF THE DRAWINGS

FIG. 7 shows additional waveforms of the circuit in FIG. 5.

FIG. 8 shows waveforms of the circuit in FIG. 5 where the resonator is both stopped and re-started.

DETAILED DESCRIPTION OF EMBODIMENTS

Figure 1:
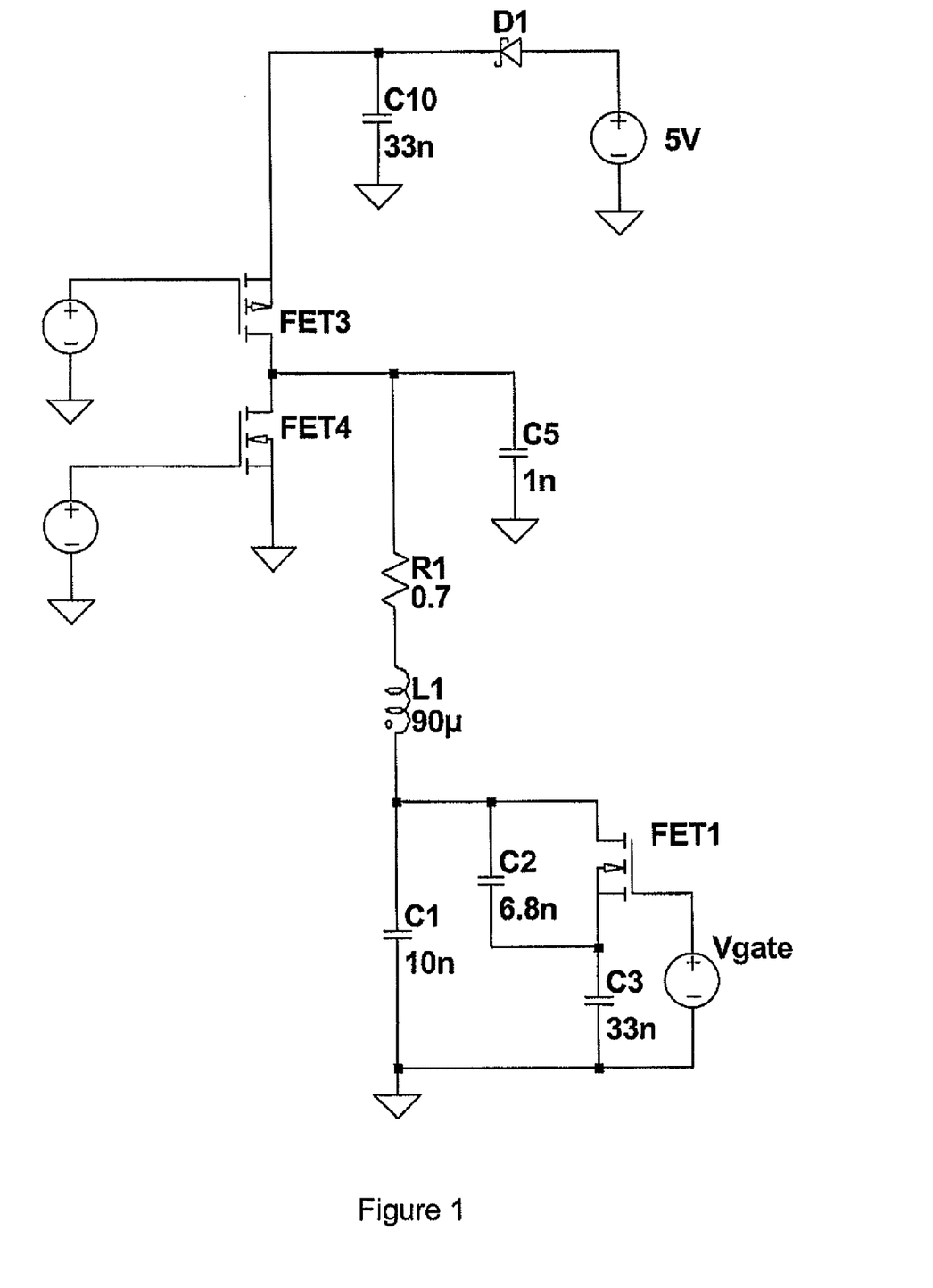
FIG. 1 is a schematic of an interrogator incorporating a self-adaptive resonator, negative feedback, and a high Q antenna.

FIG. 1 shows an embodiment of an RFID interrogator incorporating a nonlinear resonator. The resonator comprises an antenna with inductance 90 mH and series resistance of 0.7Ω, giving a Q at 125 kHz of approximately 100. The antenna is connected to a capacitive network C1, C2, C3 and MOSFET FET1. The capacitive network has two distinct states with the FET1 on and FET1 off. When FET1 is on the total capacitance is 43 nF, since C2 is shorted out, whereas when FET1 is off the total capacitance is 15.6 nF. FET1 is turned on or off depending on the amplitude of the waveform at the source potential, relative to the fixed gate voltage Vgate. The duty cycle of the FET1 on state varies with the resonance amplitude, which naturally adjusts to allow the resonator to match the 125 kHz stimulus frequency. The amplitude of the resonator is controlled through Vgate, increasing as this voltage is reduced to negative voltages.

The stimulus to the resonator is supplied through the complementary MOSFET pair, FET3 and FET4, which are controlled through two voltage sources. The stimulus pulse is approximately 2.5 µs in duration, also with a deadband delay between the two voltage sources to prevent shoot through current.

The resonance energy supply is provided by the 5V voltage source that is connected to the positive stimulus pulse through shottkey diode D1. C10 provides a path for transient current before the required energy to maintain the resonance is drawn through D1. The combination of energy supply through D1 and C10 also provides feedback that reduces transient changes in the resonator amplitude in response to load modulations from a tag. This property has been shown to increase the speed of response of an RFID reader to load modulations, whilst still maintaining low loss for steady state powering signals. One alternative to this implementation of feedback is PWM feedback from the resonance amplitude to the width of the stimulus pulse supplied through FET3 and FET4.

Figure 2:
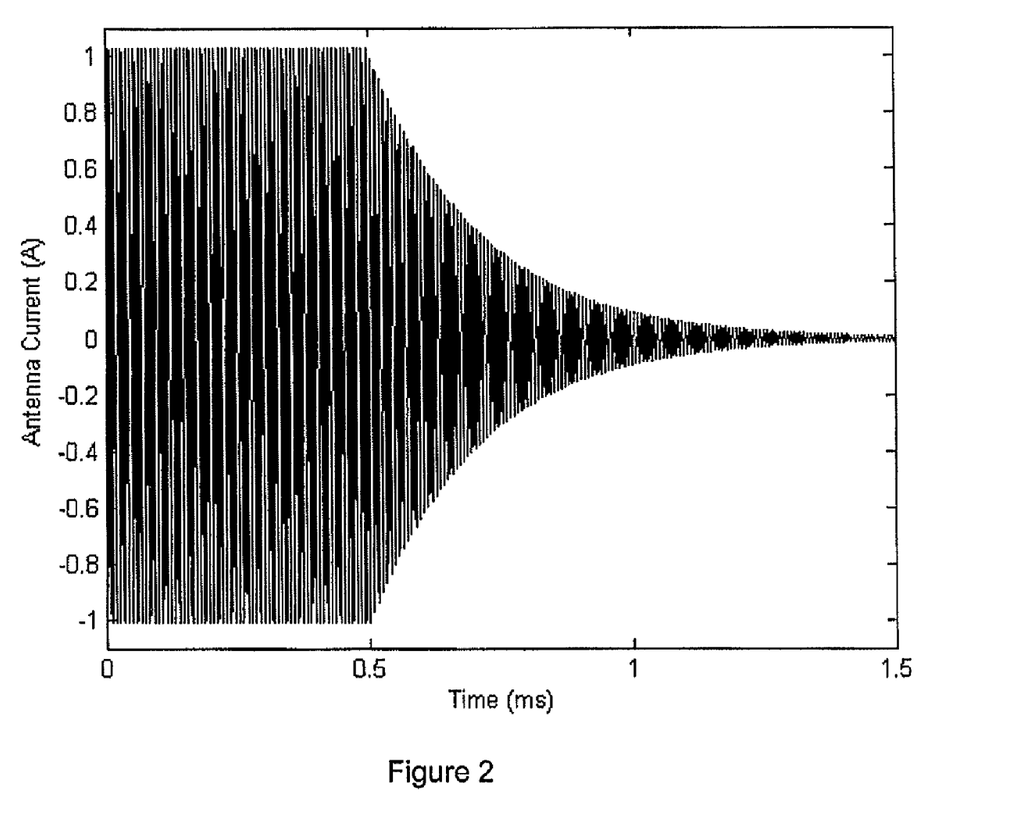
FIG. 2 is a waveform showing the free decay of the antenna current.

FIG. 2 shows the antenna current as a function of time when the stimulus pulses are turned off at approximately 0.5 ms. The resonator is initially oscillating with amplitude of approximately 1 A. When the stimulus is turned off then this follows an exponential decay over the next 1 ms. The low loss of the resonant system translates as a long decay time that does not allow for fast communication from the interrogator to the tag.

Figure 3:
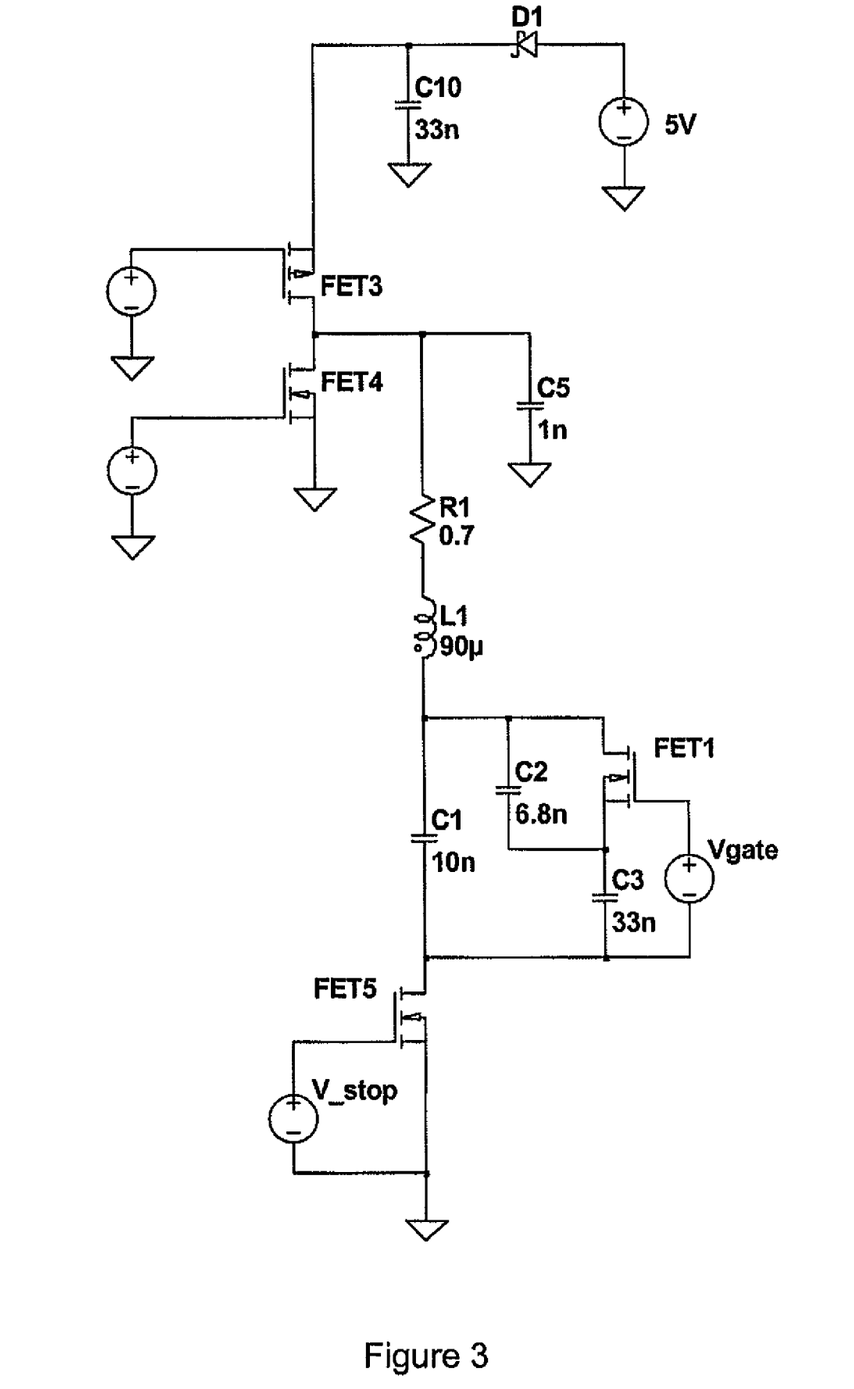
FIG. 3 is a schematic of an interrogator with a MOSFET to cut off the current in the antenna.

An alternative to the free decay is to stop the energy in the resonator with a switch such as a MOSFET. FIG. 3 shows such an arrangement where a low loss MOSFET FET5 is introduced in series with the resonance current. This is controlled by a voltage source V_stop. FIG. 4 shows waveforms that illustrate the behaviour when the resonance current is turned off.

Figure 4A:
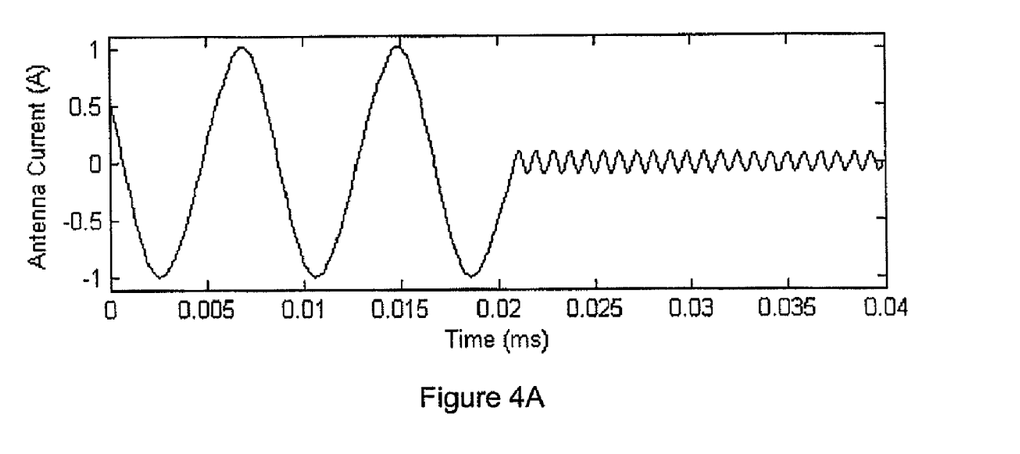
FIG. 4A is a graph of the antenna current when it is cut off.
Figure 4B:
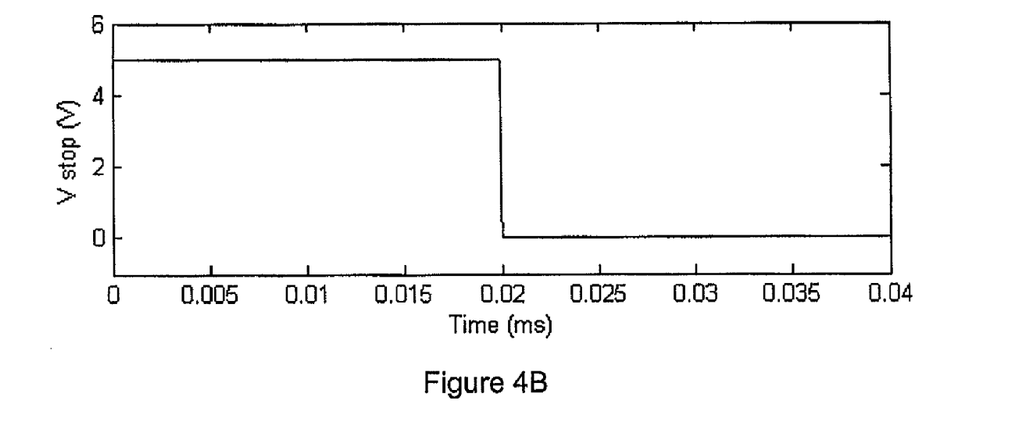
FIG. 4B is a graph of the control voltage to the cut-off MOSFET.

FIG. 4A shows the resonance current as a function of time and FIG. 4B the control voltage V_stop. FET5 is turned off during the negative portion of the antenna current, which completes its full cycle through the body diode of this MOSFET. At this point the stimulus pulses to the resonator are also halted. When the negative polarity current is complete then the MOSFET blocks the path of the resonance current, which then drops to low levels. The subsequent high frequency oscillation of the antenna current at lower amplitude is the result of the antenna resonating with a much lower capacitance corresponding to the drain capacitance of FET5 when turned off.

Figure 4C:
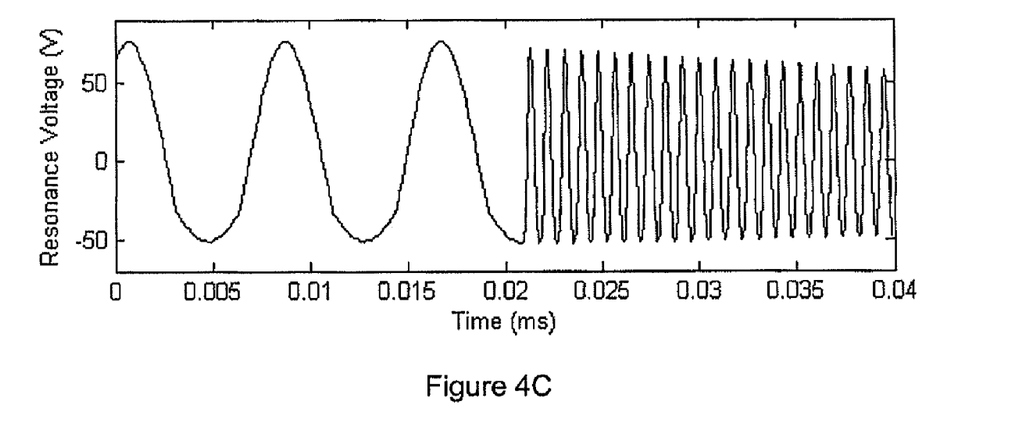
FIG. 4C is the corresponding graph of the resonance voltage.

FIG. 4C shows the corresponding graph of the resonance voltage as a function of time. Although the current drops to low levels after the MOSFET transition, the resonance voltage does not. The higher frequency of the remaining current manifests itself as a resonance voltage similar in magnitude to the earlier oscillation of the resonance.

The behaviour illustrated in FIG. 4 does lead to an output field, dependent on the antenna current, that is useful for reader to tag communication. The amplitude of the field at the tag resonant frequency drops sharply at the end of one cycle, rather than the slow free decay shown in FIG. 2. However the subsequent high frequency oscillation is likely to cause problems with the generation of interference and EMC compliance failure.

Figure 5:
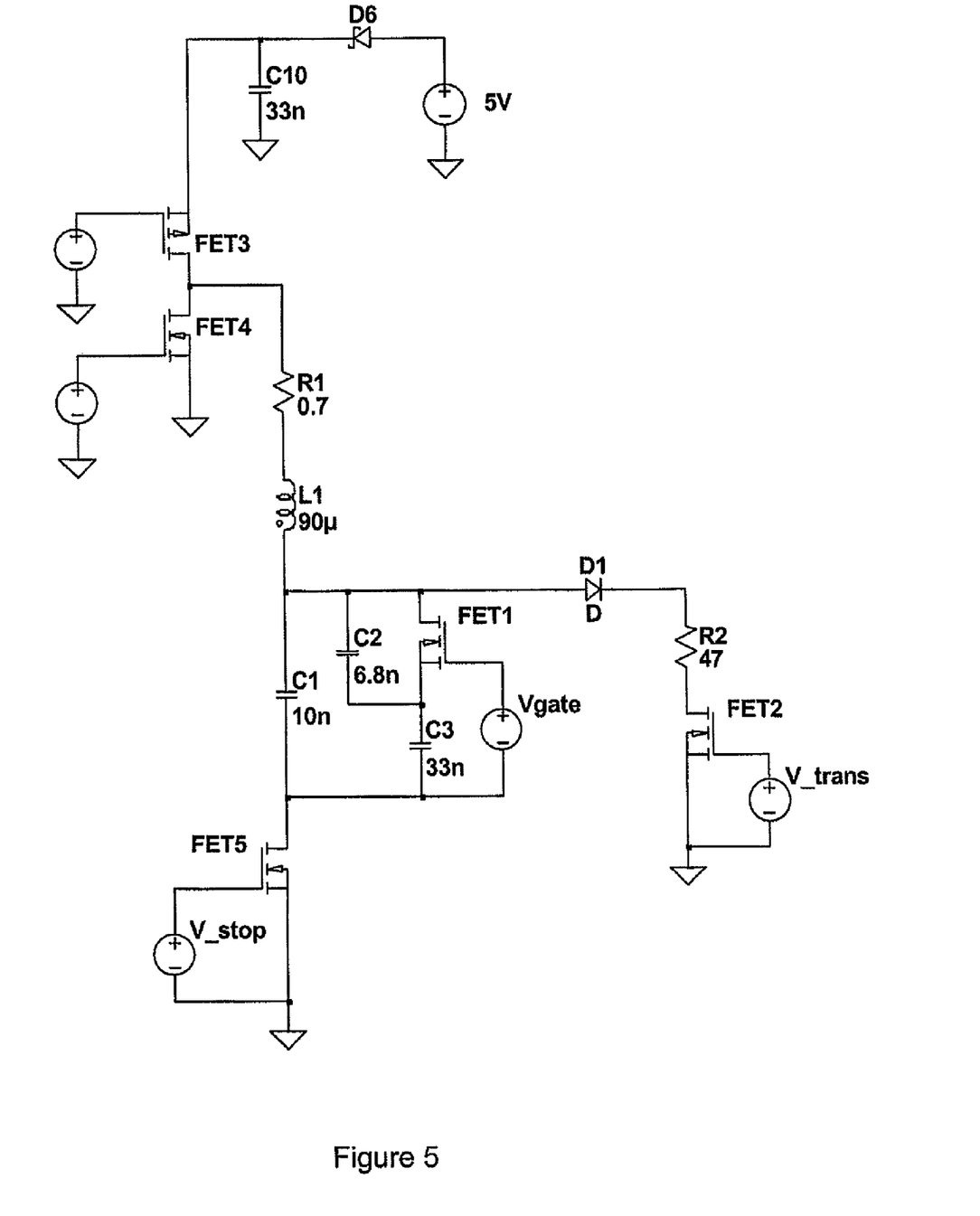
FIG. 5 is a schematic of an interrogator with an added block to dissipate the energy of the turn-off transient.

FIG. 5 shows an embodiment, similar to FIG. 3 but with an additional block that controls the oscillation of the resonator after the current is switched off by FET5. The new block comprises a diode D1, resistor R2, and MOSFET FET2. When the resonator is oscillating then FET2 is turned off by the control voltage V_trans. This prevents forward conduction through FET2 and the diode D1 prevents conduction in the opposite direction through the body diode of FET2; the block is effectively isolated from the resonator. When FET5 is turned off to stop the resonator current, then FET2 is turned on for a duration of 8 μs. When the negative portion of the antenna current completes and the resonator current is blocked then the resonance voltage jumps to positive values. However now that FET2 is on, this results in conduction through D1, R2 and FET2. The energy in the high frequency oscillation shown in FIG. 4 is dissipated in R2 and the resonance stops cleanly.

Figure 6A:
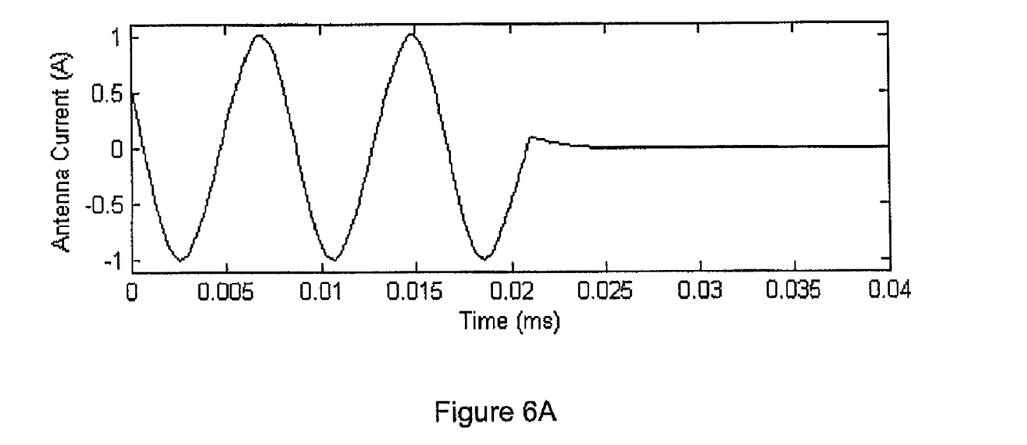
FIG. 6A is a waveform of the circuit in FIG. 5 when the antenna current is cut off and the turn-off transient controlled.
Figure 6B:
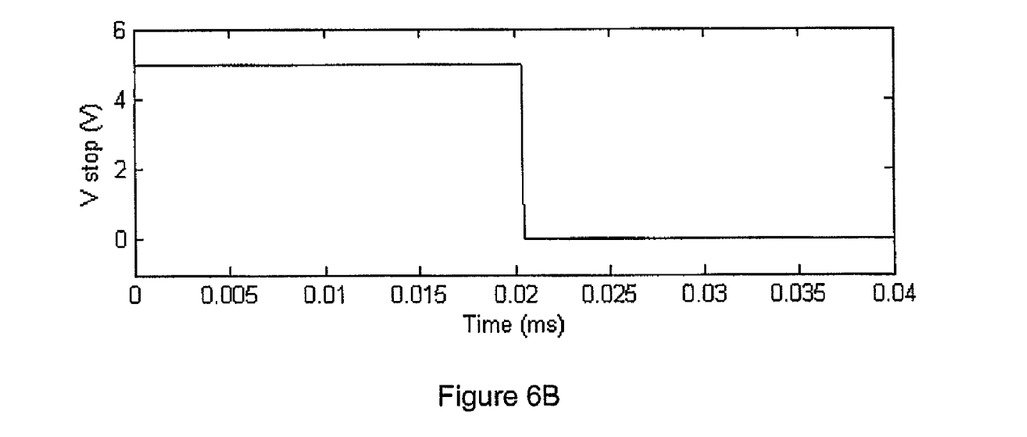
FIG. 6B is the control voltage to the turn-off MOSFET.
Figure 6C:
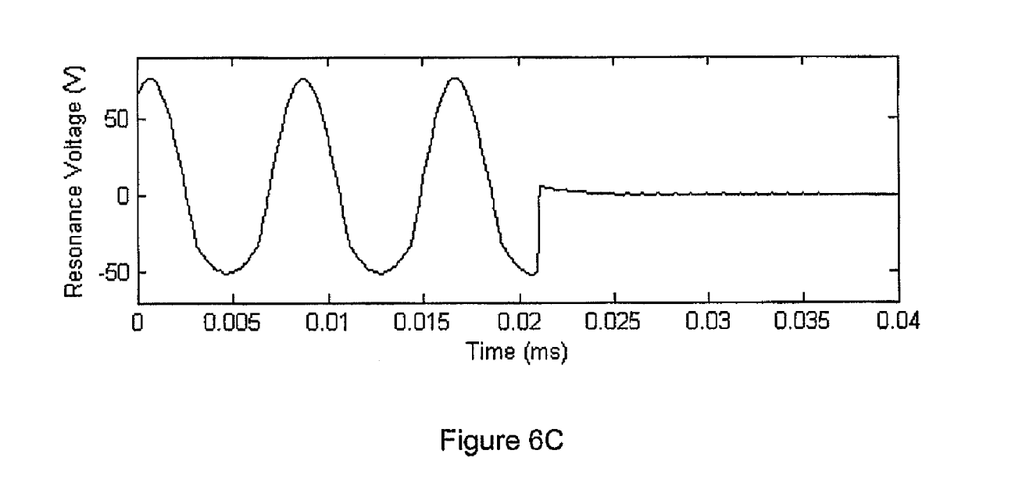
FIG. 6C is the corresponding graph of the resonance voltage.
Figure 7A:
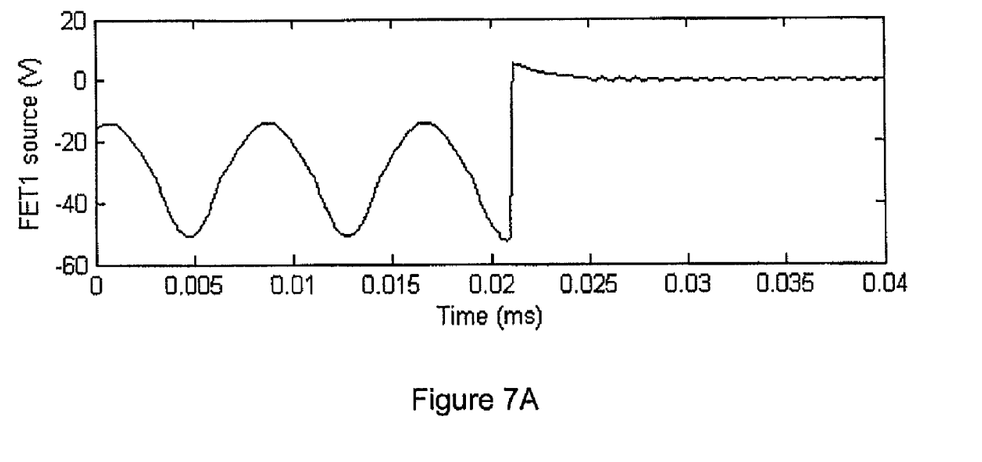
FIG. 7A shows the source voltage of the resonance MOSFET, FIG. 7B the drain voltage of the cut-off MOSFET.
Figure 7B:
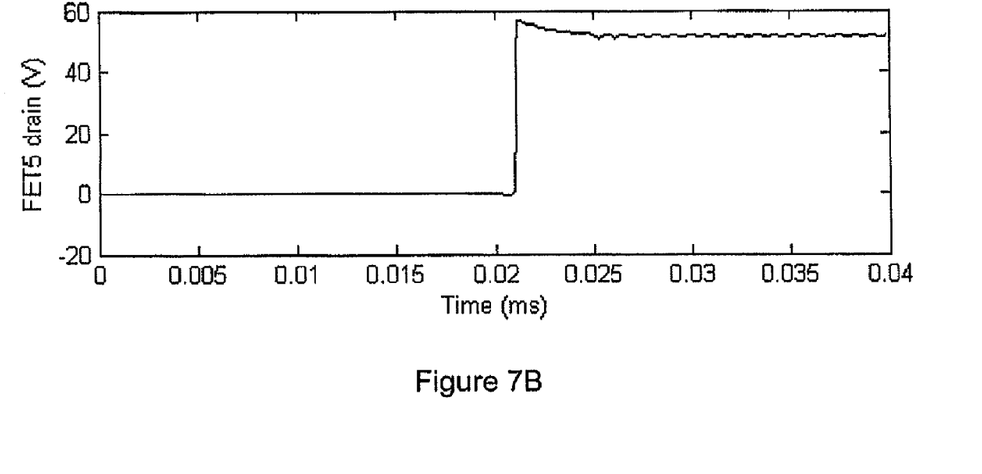
Figure 7C:
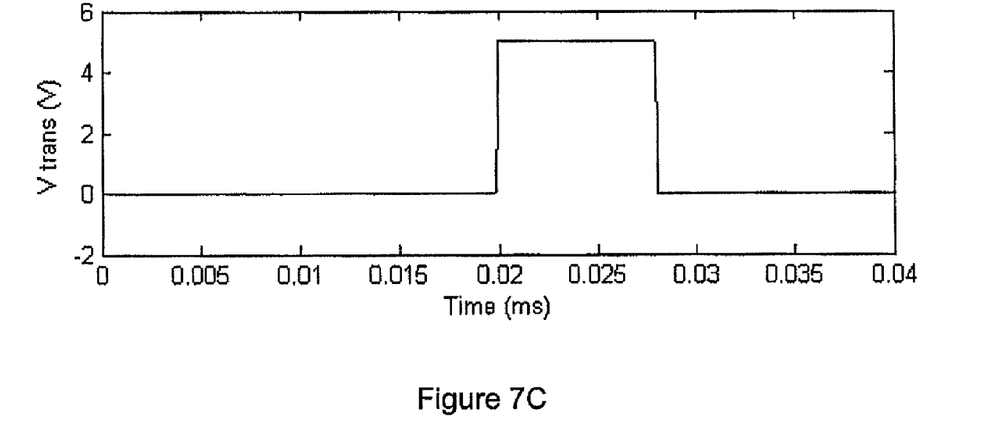
FIG. 7C shows the control voltage to the MOFSET used for control of the turn-off transient.

FIG. 6 shows this behaviour with similar graphs to those shown in FIG. 4. Now the high frequency oscillation in the antenna current and resonance voltage is absent and the modulation of the interrogator field has near-ideal turn off characteristics. Additional graphs are shown in FIG. 7 that show the final state of the resonator. FIG. 7 shows the voltage at the FET1 source, which jumps from negative values to approximately 0V once the antenna current is stopped. The corresponding voltage at FET5 drain shows a jump from 0V to approximately 50V. FIG. 7C shows the control voltage V_trans, which turns on FET2 for 8 ms.

The resonator current is close to zero when it is turned off, and nearly all the resonance energy is stored as charge in the capacitors. This charge is responsible for the voltage that results at the FET5 drain and is still available as energy available to restart the resonator when required. Graphs that illustrate the behaviour of the resonator when it is re-started are shown in FIG. 8.

Figure 8A:
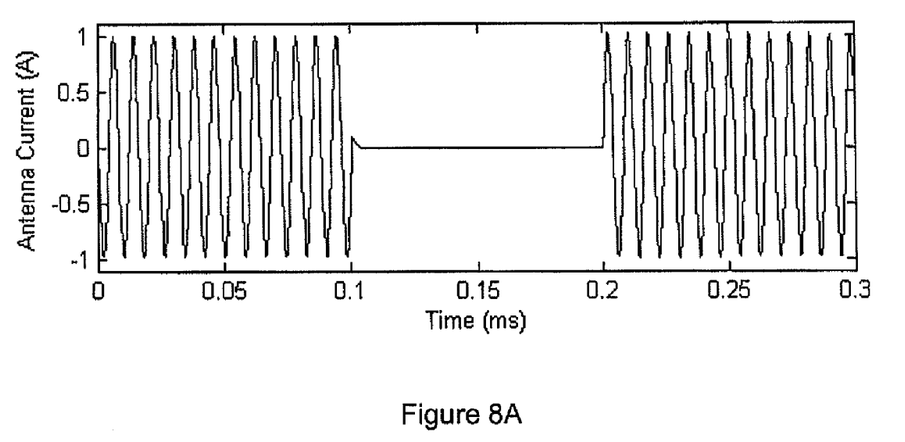
FIG. 8A shows the antenna current.
Figure 8B:
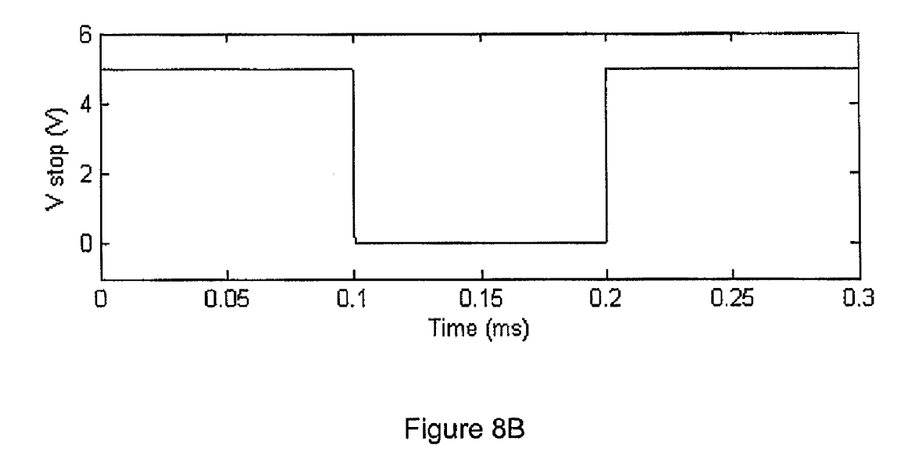
FIG. 8B shows the control voltage to the turn-off MOSFET.
Figure 8C:
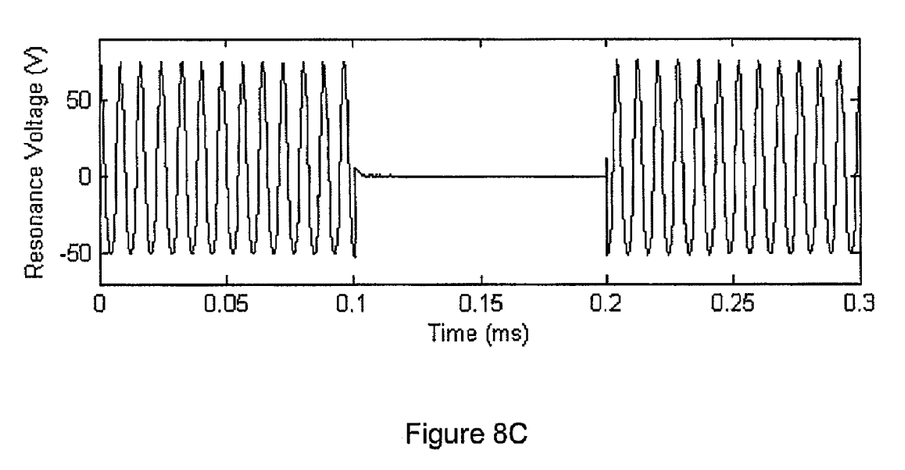
FIG. 8C shows the resonance voltage.

FIG. 8A shows the antenna current at a function of time when the resonator is stopped at approximately 0.1 ms and turned on again at 0.2 ms. FIG. 8B shows the corresponding voltage waveform of V_stop and FIG. 8C shows the resonance voltage. When the resonator is turned back on, V_stop jumps to 5V, turning on FET5 and allowing the resonance current to flow. At this point the stimulus pulses are also turned back on allowing the resonator to maintain its amplitude when re-started. The timing of the stimulus pulses and the turn on of the antenna current with V_stop may be adjusted to smooth the re-start behaviour. In this example the turn on takes place 100 μs after turn off and this results in the stimulus pulses at a similar point in the resonance cycle right from turn on. If these are mismatched then there will be some transients in the amplitude at turn on, however these are minimised through the feedback present in the interrogator design.

The use of feedback is not critical for a smooth turn on however it does increase the tolerance in the accuracy of the turn on time that results in acceptable behaviour. The interrogator may measure the behaviour in normal oscillation to determine the timing of the stimulus pulses relative to the resonance current. It may then use this to calculate a turn on time that will result in a smooth waveform. Alternatively the interrogator may turn on with a default timing and the feedback may reduce the transient changes in the resonator amplitude.

In summary, this embodiment shows how a high Q resonator may be used in an RFID interrogator for fast reader to tag communications. The interrogator current may be turned off quickly, with the energy of the resonator stored as charge on the system capacitors. In the process unwanted signals may be generated as a result of the sharp turn off and a method for control of such signals has been described. When the resonator is re-started the stored energy may be released and the resonator started in a high amplitude state without a gradual ramp up. As a result the interrogator may have excellent turn off and turn on modulation characteristics allowing high speed reader to tag communications. The re-use of the resonance energy gives the interrogator high efficiency operation not only when used as a reader, but also for reader to tag communications.

The resonator used in the embodiments described is a nonlinear resonator that matches to the stimulus over a range of frequencies. Such a resonator may have advantages in high Q RFID systems, however there is no intended limitation to this class of resonator. In fact a conventional linear resonator may be employed in the same manner. The linear resonator may be stopped sharply with the energy stored for subsequent re-use and control of any transient oscillations generated. The linear resonator may also include feedback to minimise transients in the amplitude of the resonance, which may also speed up the response of the reader to load modulations in a tag.

The 125 kHz frequency band chosen for the embodiments is purely by way of example. Applications of the invention are not limited to frequencies around this band, and extend to include all frequencies ranging from sub-sonic to microwave frequencies and beyond. More specifically to RFID, all common RFID frequency bands are included, such as 125 kHz, 134 kHz, 13.56 MHz, 869 MHz, 915 MHz, and the like.

The modulation method may be used in an RFID interrogator for all reader to tag communications including tag programming and communication for encryption. It may also be employed for half duplex reading of a tag. In fact any communication that requires high speed and low loss may benefit from the methods disclosed within.

Figure 9A:
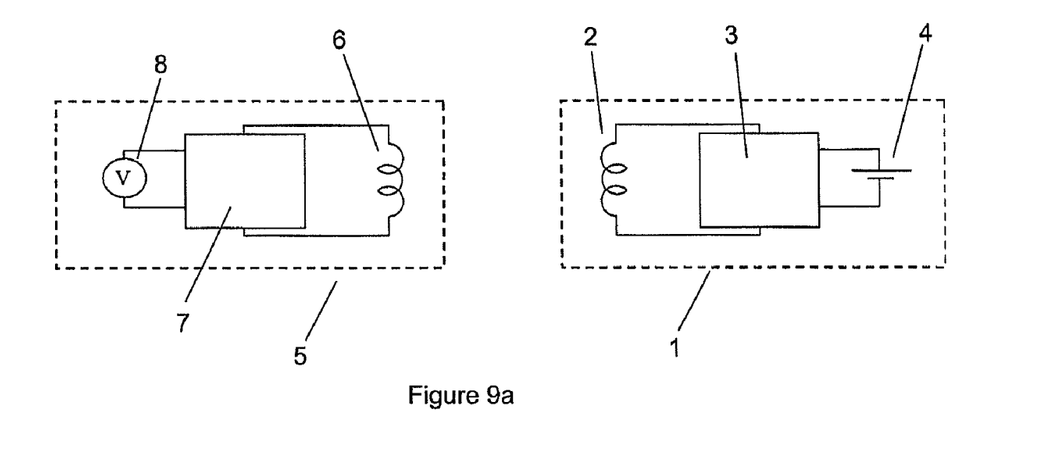
FIG. 9a shows a block diagram of an active RFID tag and active RFID tag reader.

FIG. 9a shows a further embodiment of the invention. Here an active tag 1 is shown comprising an antenna 2 attached to an electronics block 3 containing the components that resonate with the antenna and associated control, and also a battery 4 to power the active tag. The active tag communicates with a reader 5, which also includes an antenna 6, an electronics block 7, and a power source 8. The power source may be a battery or a mains power supply. The reader may also be another active tag capable of communicating with the active tag 1.

Figure 9B:
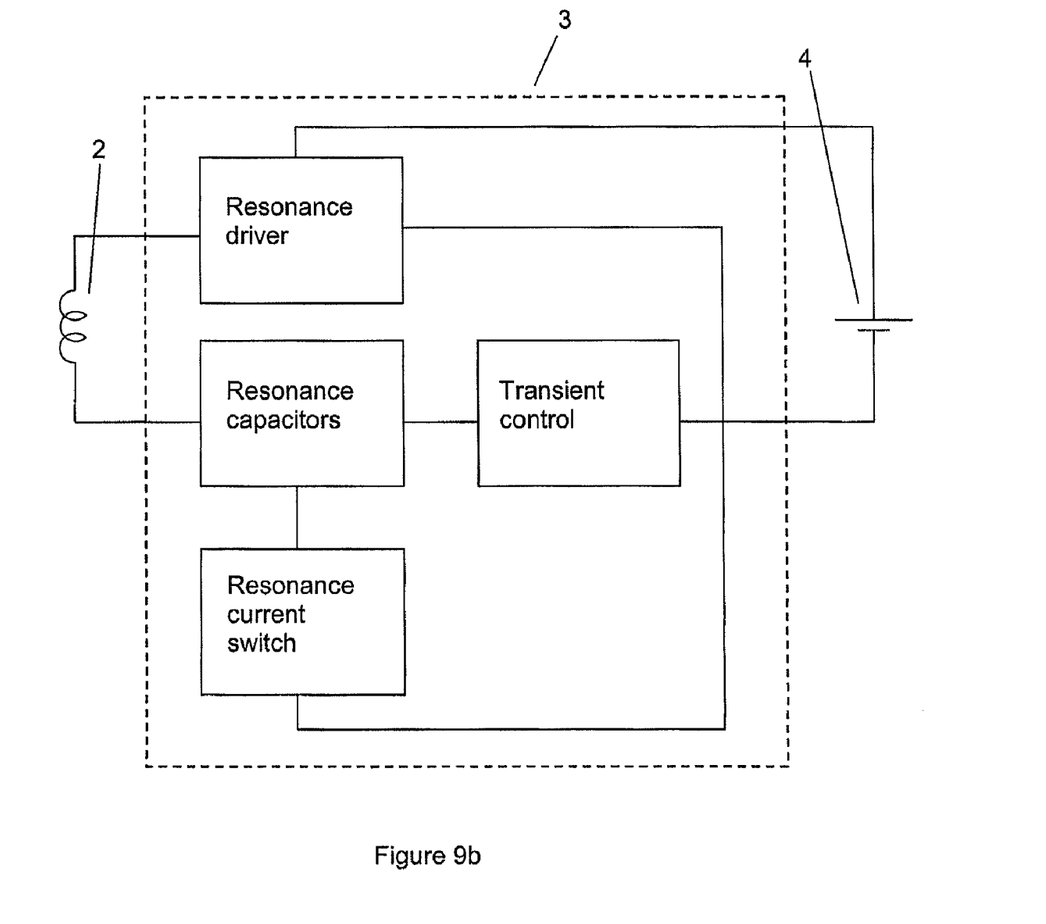
FIG. 9b shows a more detailed block diagram of the active RFID tag.

FIG. 9*b* shows an embodiment of the active tag shown in FIG. 9*a*. This diagram shows the antenna 2 and battery 4 together with a more detailed block diagram of the electronics block 3. The electronics block comprises a resonance driver that drives the antenna and resonance capacitors. The resonance capacitors may form a nonlinear resonator that adapts to the stimulus frequency, as shown in earlier embodiments, or a conventional linear resonator. Also shown is a resonant current switch that can turn the resonance current on and off, storing the resonance energy as charge on the resonance capacitors. The resonance current switch may be a mosfet. Lastly, there is a transient control block that controls the transients that would otherwise be generated when the resonator is stopped or started.

Figure 9C:
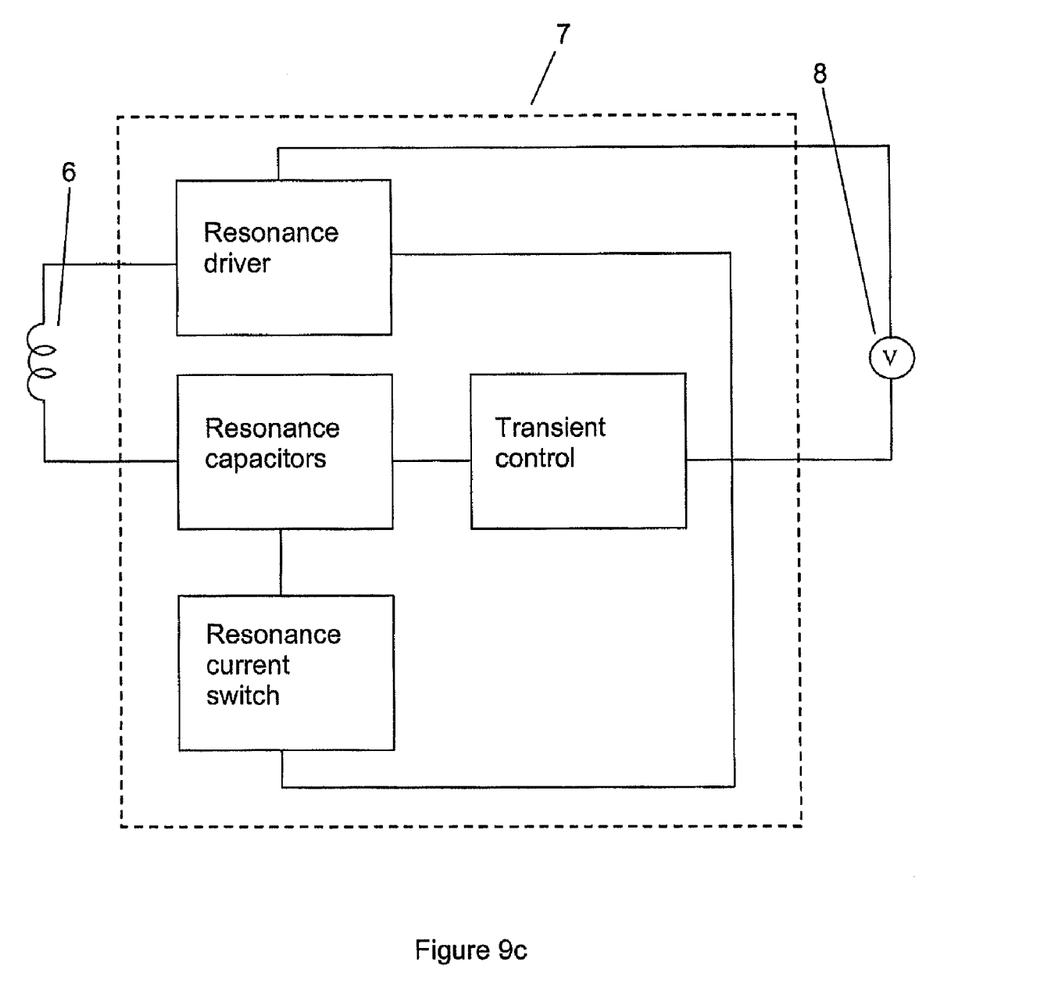
FIG. 9c shows a more detailed block diagram of the active RFID tag reader.

FIG. 9*c* shows an embodiment of the reader shown in FIG. 9*b*. This diagram shows the antenna 6 and power source 8 together with a more detailed block diagram of the electronics block 7. The electronics block comprises a resonance driver that drives the antenna and resonance capacitors. The resonance capacitors may form nonlinear resonator that adapts to the stimulus frequency, as shown in earlier embodiments, or a conventional linear resonator. Also shown is a resonant current switch that can turn the resonance current on and off, storing the resonance energy as charge on the resonance capacitors. The resonance current switch may be a mosfet. Lastly, there is a transient control block that controls the transients that would otherwise be generated when the resonator is stopped or started.

In the embodiment shown in FIGS. 9*a* to 9*c* the methods outlined herein have been applied to both an active tag and an active tag reader. It is noted that these methods may equally well be applied in the tag only, or in the reader only, and there is no implied limitation to using them in combination.

Figure 10:
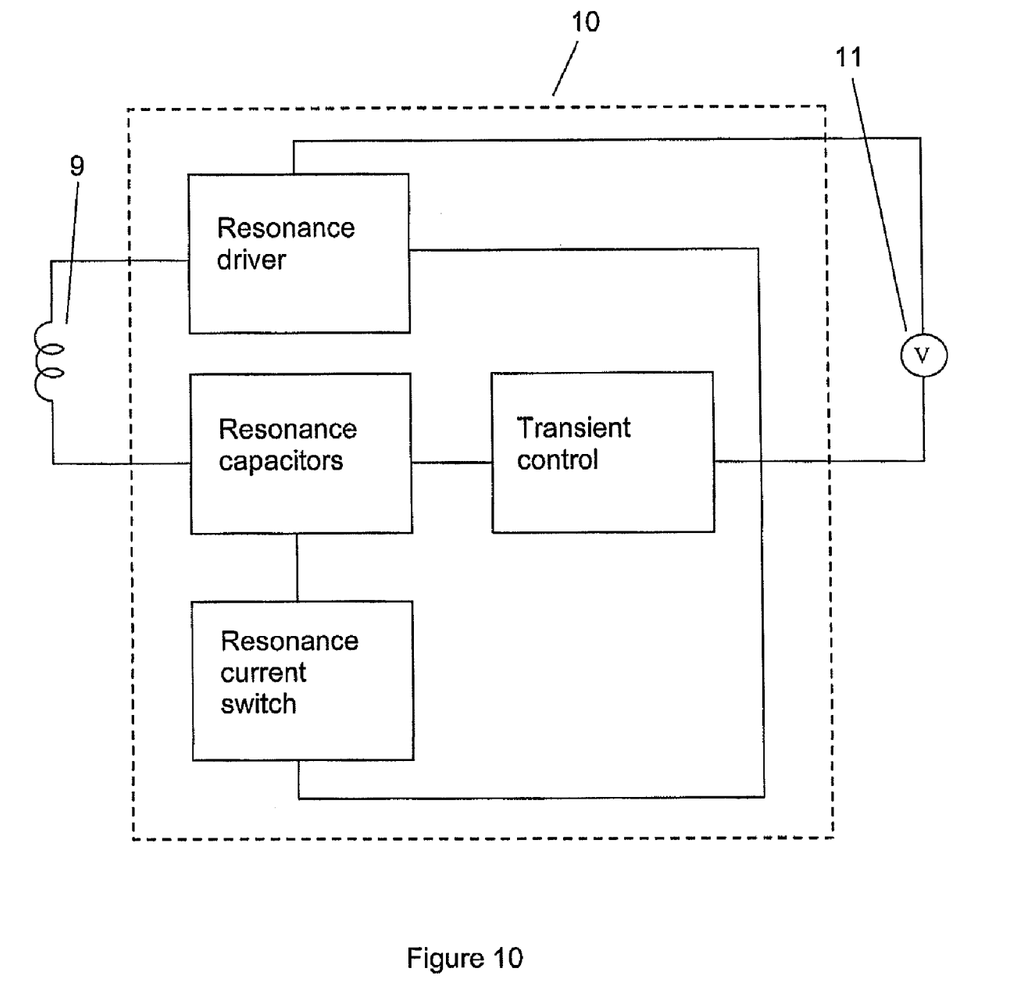
FIG. 10 shows a block diagram of a general radio transmitter.

FIG. 10 shows a block diagram of a general purpose radio transmitter. This contains the same elements as the active tag and active tag reader including an antenna 9, power supply 11, and an electronics block 10. The electronics block comprises a resonance driver that drives the antenna and resonance capacitors. The resonance capacitors may form a nonlinear resonator that adapts to the stimulus frequency, as shown in earlier embodiments, or a conventional linear resonator. Also shown is a resonant current switch that can turn the resonance current on and off, storing the resonance energy as charge on the resonance capacitors. The resonance current switch may be a mosfet. Lastly, there is a transient control block that controls the transients that would otherwise be generated when the resonator is stopped or started.

Through the use of the resonance current switch and the transient control block the general purpose radio transmitter may be used to achieve high speed amplitude modulation with a high Q resonator. This offers improved performance over a conventional system that would limit the speed of data modulation, or alternatively would reduce the efficiency of the system, loosing the benefits of the high Q resonator. In fact for any resonator Q, this approach offers increased speed of amplitude modulation, even for lower values of Q. When transmitting a fixed data length then the duration of the transmission may be reduced, which not only allows for faster communications but also reduced power. The system may be setup to use this reduced power requirement for increased battery lifetime, or alternatively the battery lifetime may be kept constant and the resonator amplitude increased. This will increase the range of the transmitter.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A transmitter comprising:
   a resonant circuit including at least one capacitor; and
   a driver coupled to drive said resonant circuit,
   wherein said resonant circuit includes a resonance regeneration system configured to modulate an amplitude of a resonant signal in said resonant circuit such that (a) when an amplitude of said resonant signal is reduced by the resonance regeneration system, energy is stored in the at least one capacitor and (b) when said amplitude is increased by the resonance regeneration system, the energy stored in the at least one capacitor is used to regenerate said resonance signal.

2. The transmitter as claimed in claim 1 wherein said resonance regeneration system comprises a switch in series with said at least one capacitor, and an oscillator synchronised to said resonant signal to control said switch in series with said at least one capacitor.

3. The transmitter as claimed in claim 1 further comprising a transient control system to dissipate energy not stored by said resonance regeneration system.

4. The transmitter as claimed in claim 3 wherein said transient control system comprises a switch coupled to an energy dissipating device, and an oscillator synchronised to said resonant signal to control said switch coupled to an energy dissipating device.

5. The transmitter as claimed in claim 4, wherein said resonance regeneration system comprises a switch in series with said at least one capacitor, and an oscillator synchronised to said resonant signal to control said switch;
   wherein said switch of said resonance regeneration system and said switch of said transient control system are controlled in synchronism such that (a) when said resonance regeneration system is acting to store energy, said transient control system is acting to dissipate energy, and (b) when said resonance regeneration system is acting to regenerate said resonant signal, said transient control system is not substantially dissipating energy.

6. The transmitter as claimed in claim 5 wherein said switch of said resonance regeneration system and said switch of said transient control system each comprise an FET.

7. The transmitter as claimed in claim 1 wherein said driver comprises a push-pull driver.

8. The transmitter as claimed in claim 1 further comprising a feedback circuit to compensate for transient changes in amplitude of said resonant signal.

9. The transmitter as claimed in claim 8 wherein said feedback circuit comprises a PWM (pulse width modulating) circuit or a passive feedback circuit.

10. The transmitter as claimed in claim 1 wherein said resonant circuit comprises a non-linear resonant circuit.

11. The transmitter as claimed in claim 10 wherein said resonant circuit comprises an inductor coupled to a first capacitor to form said resonant circuit, the resonant circuit further comprising (1) a controllable element, (2) a second capacitor coupled with said first capacitor by said controllable element, and a control device to control said controllable element such that a total effective capacitance of said first and second capacitor varies over a duty cycle of an oscillatory signal in said resonant circuit.

12. The transmitter as claimed in claim 10 wherein said controllable element comprises a transistor and wherein said control device comprises a bias circuit for said transistor.

13. The transmitter as claimed in claim 1, incorporated into an active RFID tag.

14. The transmitter as claimed in claim 1, incorporated into a reader for an active RFID tag reader.

15. A transmitter comprising a resonant circuit including an antenna, the resonant circuit comprising at least a capacitor, and FET switch coupled in series with said capacitor, and a signal generator synchronized to a resonant signal when the resonant signal oscillates in said resonant circuit, wherein said signal generator is configured to control said FET switch, and wherein the circuit further comprises a controller to stop said signal generator to stop oscillation of said resonant signal in said resonant circuit at the off cycle of an amplitude modulation of the resonant circuit.

16. The transmitter as claimed in claim 15, wherein the resonant circuit further comprises a second FET switch coupled to said resonant circuit, and a second-FET controller to control said second FET to apply damping to said oscillation of said resonant signal after said controller has stopped said oscillation.

17. The transmitter as claimed in claim 15 further comprising a driver coupled to drive said resonant circuit, and wherein said controller is further configured to stop said driver driving said resonant circuit when said signal generator is stopped.

18. A transmitter comprising a system for switching a resonant oscillation on and off in a resonant circuit using a switch coupled in series with said resonant circuit, the system further comprising:
- means for driving said resonant circuit with a stimulus;
- means for determining a relative timing between said stimulus and an output current from said resonant circuit;
- means for switching said oscillator off using said switch and for stopping said stimulus; and
- means for switching said oscillation on and for restarting said stimulus, said means for switching said oscillation on and for restarting said stimulus being configured to use said determined relative timing to control a relative timing between switching said resonant oscillation on and said stimulus restarting.

19. The transmitter as claimed in claim 18, wherein said resonant circuit comprises a non-linear resonant circuit.

20. The transmitter as claimed in claim 18, wherein said output current comprises a current to an antenna of said transmitter.

* * * * *